US008923010B2

(12) United States Patent
Parish

(10) Patent No.: US 8,923,010 B2
(45) Date of Patent: Dec. 30, 2014

(54) ELECTRONIC COMPONENT FOR SURFACE MOUNTING

(75) Inventor: Scott Parish, Milton Keynes (GB)

(73) Assignee: Murata Power Solutions (Milton Keynes) Limited, Milton Keynes (GB)

( * ) Notice: Subject to any disclaimer, the term of this patent is extended or adjusted under 35 U.S.C. 154(b) by 0 days.

(21) Appl. No.: 13/278,386

(22) Filed: Oct. 21, 2011

(65) Prior Publication Data

US 2012/0099288 A1  Apr. 26, 2012

(30) Foreign Application Priority Data

Oct. 22, 2010 (GB) .................................. 1017933.1

(51) Int. Cl.
*H05K 7/00* (2006.01)
*H05K 1/14* (2006.01)
*H01F 27/06* (2006.01)
*H02M 7/00* (2006.01)

(52) U.S. Cl.
CPC .......... *H05K 1/145* (2013.01); *H01F 2027/065* (2013.01); *H02M 7/003* (2013.01)
USPC ........................................... 361/782; 361/752

(58) Field of Classification Search
CPC .. H05K 1/145; H01F 2027/065; H02M 7/003
USPC .............. 361/760, 751, 306.1, 768, 777, 782, 361/752; 174/260, 261, 255; 439/65, 75, 83
See application file for complete search history.

(56) References Cited

U.S. PATENT DOCUMENTS

| 4,661,792 | A | 4/1987 | Watkins |
| 6,638,112 | B1 | 10/2003 | Walker et al. |
| 6,853,558 | B1* | 2/2005 | Dixon ........................... 361/761 |
| 6,876,555 | B2* | 4/2005 | Matsumoto et al. .......... 361/782 |
| 7,821,373 | B2* | 10/2010 | Cheng et al. .................. 336/200 |
| 2004/0027223 | A1 | 2/2004 | Hsu |
| 2007/0194875 | A1* | 8/2007 | Wang et al. .................... 336/199 |
| 2008/0278922 | A1 | 11/2008 | Wimmer |
| 2010/0033282 | A1* | 2/2010 | Hsu et al. ......................... 336/65 |
| 2010/0230147 | A1 | 9/2010 | Gokan et al. |
| 2011/0084789 | A1* | 4/2011 | Park et al. ........................ 336/65 |

FOREIGN PATENT DOCUMENTS

| CN | 100538933 C | | 9/2009 |
| EP | 1 191 635 A2 | | 3/2002 |
| FR | 2176278 A5 | | 10/1973 |
| JP | 1987-254176 | * | 1/1986 |
| JP | 62-176197 A | | 8/1987 |
| JP | 62176197 | * | 8/1987 |
| JP | 09-036510 A | | 2/1997 |
| WO | WO2010/100726 | * | 9/2010 |

OTHER PUBLICATIONS

Official Communication issued in corresponding United Kingdom Patent Application No. GB10179331, mailed on Feb. 25, 2011.

* cited by examiner

*Primary Examiner* — Yuriy Semenenko

(74) *Attorney, Agent, or Firm* — Keating & Bennett, LLP

(57) ABSTRACT

An electrical component for surface mounting, such as a DC-DC power converter includes a body portion including one or more surface mounting pins to connect the body portion to a circuit board, and first and second circuit boards including respective circuit elements mounted thereon. The first and second circuit boards are mounted on the body portion, such that sides of the first and second circuit board on which the circuits are mounted face the interior of the device and the reverse sides of the first and second circuit boards define an exterior surface of the component. In this way, no separate housing for the component is required. The size of the electrical component can therefore be kept small, and protection provided to the circuit elements by the reverse side of the circuit board.

28 Claims, 7 Drawing Sheets

ELECTRONIC COMPONENT FOR SURFACE MOUNTING

BACKGROUND OF THE INVENTION

1. Field of the Invention

The present invention relates to an electronic component for surface mounting applications, and in particular to a power supply device including a DC-DC converter.

2. Description of the Related Art

A known power device module for surface mounting applications is illustrated in FIGS. 1a-1d. FIG. 1a is a top view of the device; FIGS. 1b and 1d are side views; and FIG. 1c is an isometric view.

The module includes a generally rectangular transfer moulded housing 10 forming a closed device in which the converter electronics are contained. Terminal connections 11 from the internal electronics pass through the sides and form connecting feet 12 that can be attached to a base board (not shown). The module can be built using a transfer moulded lead frame, allowing the product to be developed with minimum tolerances while maintaining a small size and flat top and bottom sides for ease of handling.

The power device module shown in FIGS. 1a-1d is for surface mounting applications, meaning it is constructed and sold in the form shown in FIGS. 1a-1d for attachment to a circuit board. In practice, a large number of modules are loaded onto a delivery ribbon, which is then fed into an assembly line machine for pick and place processing. The module housing of devices intended for surface mounting applications typically therefore have a flat top side, for protection of the internal components, and so that the assembly line machine can easily pick the module, detach it from the feed ribbon, and place it at the desired location on a circuit board. The external terminal connections are then soldered in place by a further assembly line tool.

Changes in the materials which are considered acceptable for use in manufacture, mandated by the Restriction of Hazardous Substances (RoHS) provisions, for example, have made the reliable manufacture of such devices increasingly difficult. Soldering temperatures of lead-free solder, for example, can be around 80-100° C. greater than the soldering temperatures of solder mixtures that contain lead. When working on encapsulated devices, such as those discussed above, the increased working temperature is now sufficient to cause problems with moisture sensitivity as well as solder reflow, essentially melting solder that has already been applied internally to the module. As a result, problems with the reliability of the device can occur.

One way of dealing with solder reflow problems is to make the housing slightly larger, thereby allowing more heat to escape during the soldering process. However, devices that are small in size are advantageous, as the smaller the footprint of the device when installed on a circuit board, the more devices that can be accommodated. The device shown in FIGS. 1a-1d, for example, would typically be approximately 10 mm in length and 6 mm high. There is therefore generally no desire to increase the size of the device.

An alternative is to move towards what is known as an open frame or a semi-open frame device. This is one in which the housing does not entirely encapsulate the internal electronics, but instead allows space for the flow of air between the interior and the exterior. A power module could, for example, be constructed inside a hollow plastic box. However, because of minimum wall thickness and injection molding tolerances, the final device would necessarily be larger and more complex.

Furthermore, for DC-DC converter modules, the large number of terminations required for the components, typically nine transformer terminations and at least 4 pins for input and output, means that space is at a premium, and the size of the device is limited.

Thus, there is a need for a power module design addressing these problems.

By way of background, the construction of a known DC-DC converter is explained in more detail in Japanese Patent Application JP 62-176197. In brief, a transformer, and first and second circuit boards, including the input and output feed circuits for the transformer, are mounted on a base board. A resin cover is also mounted on the board, enclosing the circuit boards and transformer, to provide protection for the components of the device. Within the cover, the circuit boards are spaced apart, both from one another, and from the transformer, which is sandwiched in between the two circuit boards.

As a result of the space between the components, the heat generated by the circuits and the transformer can easily be dissipated. The resin cover is an electrical insulator and is selected also to have good heat dissipation characteristics.

The device shown in JP 62-176197 is an encapsulated design, not configured for surface mounting.

SUMMARY OF THE INVENTION

According to a first example of a preferred embodiment of the present invention, an electronic component for surface mounting applications includes a body portion including at least one surface mounting pin to connect the body portion to a circuit board, first and second circuit boards including respective circuit elements mounted thereon, and mounting members, wherein the first and second body portion circuit boards are mounted on the body portion by respective ones of the mounting members, such that sides of the first and second circuit boards on which the circuit elements are mounted face an interior of the electronic component and reverse sides of the first and second circuit boards define an exterior surface of the component.

Mounting the circuit boards as the sides of the component allows the footprint of the device to be greatly reduced. Additionally, as the reverse side of the circuit board acts as the external housing of the device, the need for a separate housing is removed and problems with heat accumulation are avoided.

Advantageously, the body section of the electrical component, includes: a base section in which the at least one surface mounting pin is housed, a top section providing an exterior surface of the electronic component; and an intermediate section connecting the base section and the top section.

The body portion can therefore be used to ensure that the component includes a robust construction, while the top section of the body portion can act as the top surface of the housing.

In one preferred embodiment of the present invention, the first and second body portion circuit boards are mounted on opposite sides of the body portion. This simplifies construction and provides the maximum separation for the circuit board elements, which will produce heat in operation.

At least one of the top or the base sections includes one or more conductive pins for making an electrical connection to the circuit elements mounted on the first and second circuit boards. The circuit boards include one or more through holes for making mechanical and electrical connections between the circuit boards and the conductive pins. In this way, the pins serve two purposes, and remove the need for separate dedicated manner of connecting the circuit boards in place.

The mechanical connection between the body portion and the circuit board can be strengthened by having at least one of the conductive pins extend through the through holes of the first and second circuit board from the body section, and be bent back towards the reverse side of the circuit board. The mechanical connection provided by the bent pin can assist in construction of the device when the terminals are soldered.

Where the at least one conductive pin is mounted in the base section, the circuit board can be securely fastened to the body portion in advance of the soldering process.

Furthermore, the at least one conductive pin can be made integral with a corresponding one of the at least one surface mounting pin. This simplifies the construction of the body portion, and results in the device being more reliable.

In one preferred embodiment of the present invention, the intermediate section of the body portion includes sides that extend between the base section and the top section to provide two sides of an exterior housing of the electronic component. The sides of the intermediate section include openings extending into the interior of the electronic component to facilitate the circulation of air and assist with cooling.

The intermediate section may include an internal cavity arranged to mount an electrical element, such as a transformer. In this way, the electrical component can be a power supply converter such as a DC-DC converter, or an isolator. In the case of the converter, the first and second body portion circuit boards can define the input and output feed circuits for the transformer, and the at least one conductive pin is provided in the top section and defines transformer wire wrap terminals to connect the transformer between the input and output feed circuits. The device provided in this way includes an extremely small footprint and a reliable construction.

The body portion, and first and second body portion circuit boards together define a cuboid structure for ease of handling and packing.

A method of constructing an electronic component for surface mounting applications is also provided. The method including: mounting first and second circuit boards, on which respective circuit elements are mounted, on a component body portion such that sides of the first and second body portion circuit boards on which the circuit elements are mounted face an interior of the electrical component and reverse sides of the first and second body portion circuit boards form an exterior surface of the component; wherein in the mounting step, at least one conductive pin provided on the body portion is threaded into at least one through hole on respective ones of the first and second body portion circuit boards, bent back towards one of the reverse sides of the one of the first and second body portion circuit boards and soldered in place.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An example of a preferred embodiment of the present invention will now be described in more detail with reference to FIG. 2.

Figure 2:
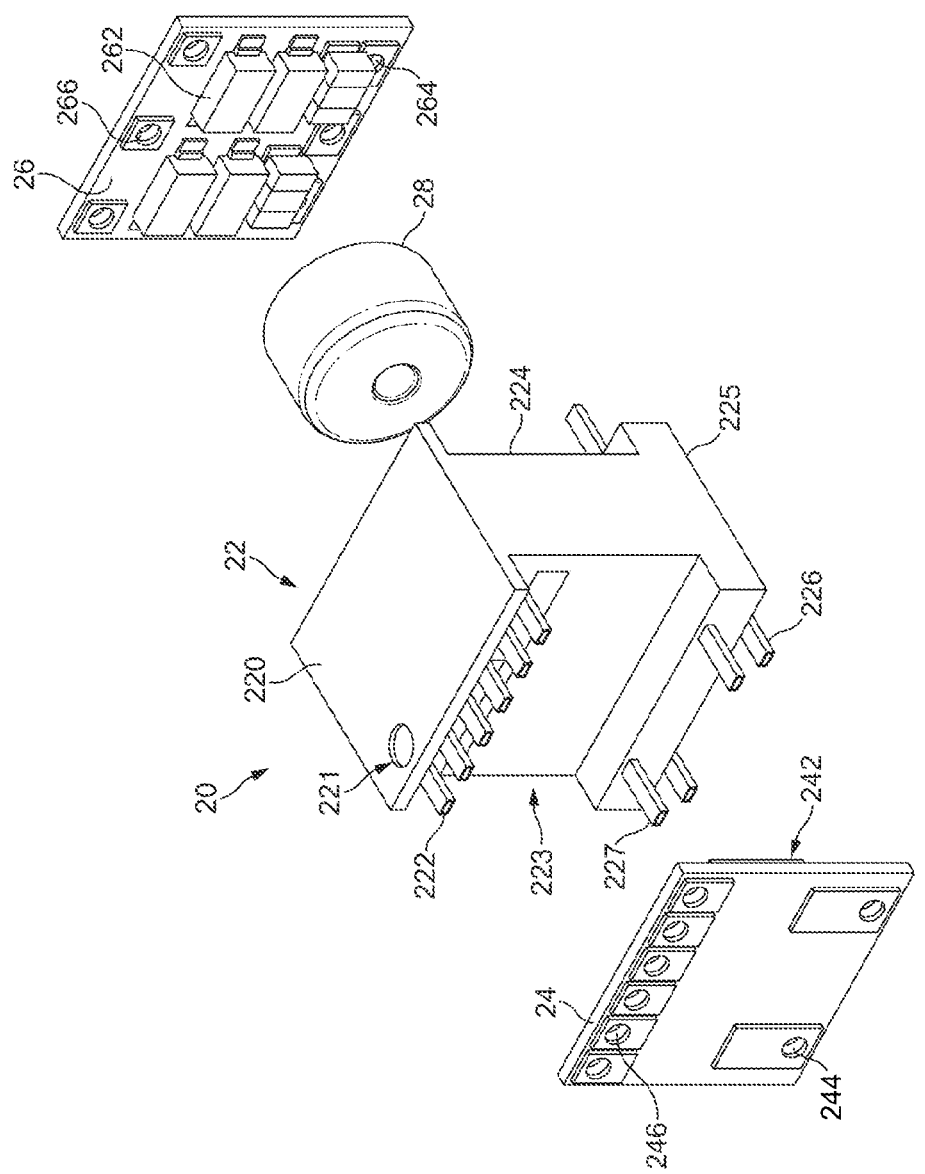
FIG. 2 is an isometric exploded view of an example of a preferred embodiment of the present invention.

FIG. 2 shows, in an exploded isometric view, an electronic device for surface mounting applications according to an example of a preferred embodiment of the present invention. The device illustrated is a self oscillating push-pull DC to DC power converter. Preferred embodiments of the present invention are not however intended to be limited to such devices, and other example devices will be discussed later.

Figure 3:
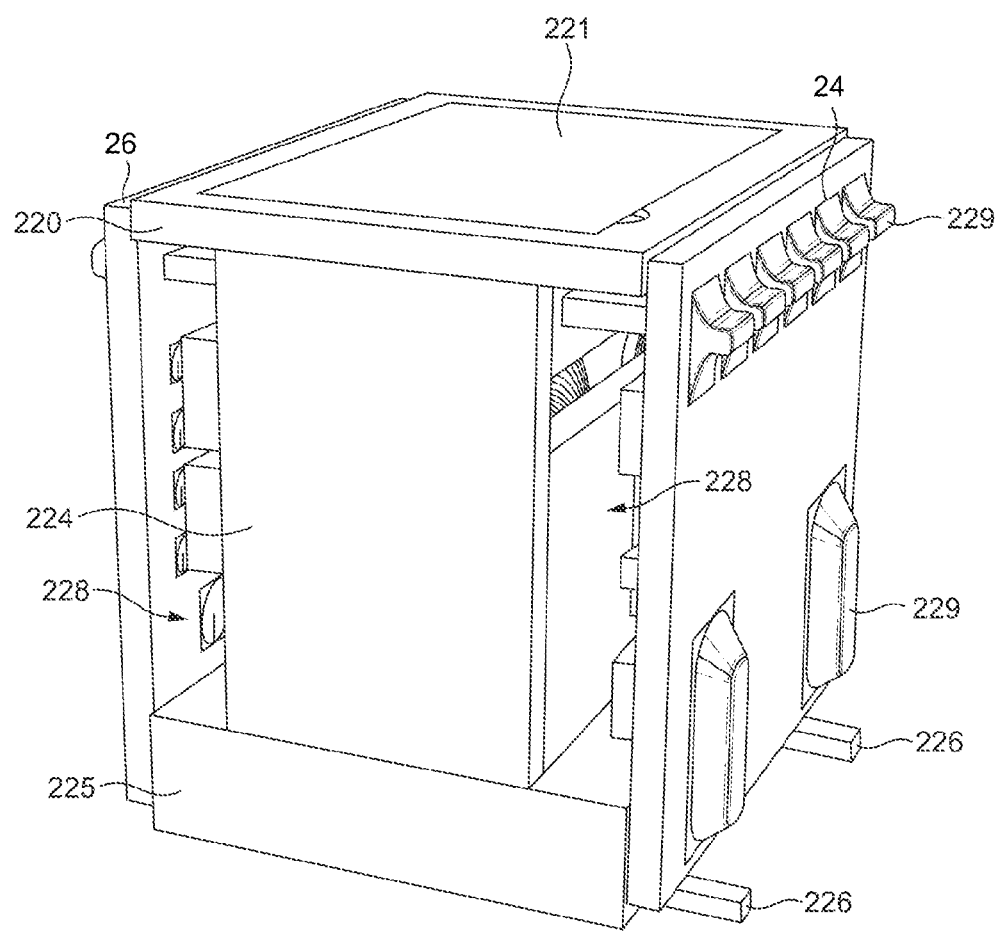
FIG. 3 is side view of the example shown in FIG. 2, fully assembled.

The DC-DC power converter 20 shown in FIG. 2 includes a central header or body portion 22, first and second circuit boards 24 and 26, and transformer coil 28. As shown in FIG. 3, to which reference should briefly now be made, the first and second circuit boards 24 and 26 attach to the body portion 22 to define two sides of the device 20, with the transformer coil 28 housed inside the body portion 22 and sandwiched inside the first and second circuit boards 24 and 26.

The first and second circuit boards 24 and 26 are referred to as placed boards, as electronic components forming the input and output feed circuits for the transformer are installed or placed on the boards. In FIG. 2, the first circuit board 24 bears the input feed circuit for the transformer, and the second circuit board 26 bears the output feed circuit. The electronic components defining the output circuit for the transformer can be seen in the view of FIG. 2, and are indicated by reference number 262. The input feed circuit 242 for the first circuit board 24 is not fully visible in the figure due to the viewing angle, as it is mounted on the reverse side of the board 24 to that shown.

Figure 1:
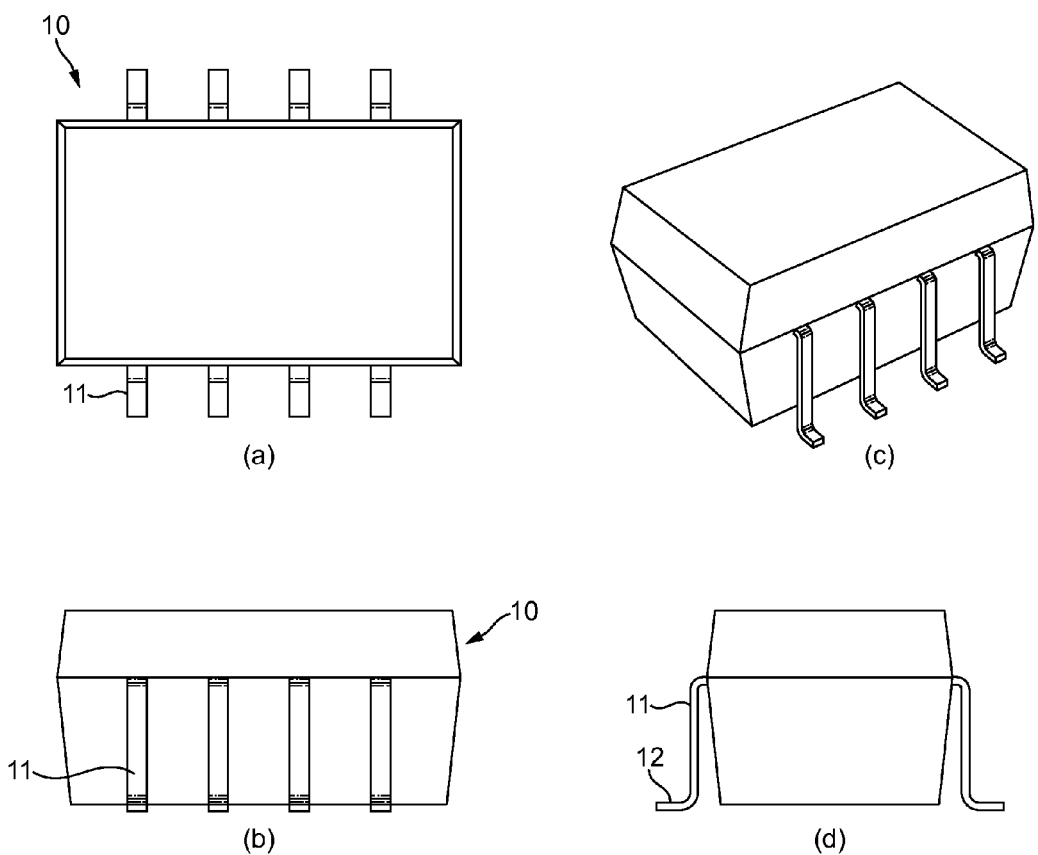
FIGS. 1a-1d illustrate a prior art device.

As indicated in FIG. 2, the input 242 and output 262 feed circuits are mounted on one side only of their respective circuit boards 24 and 26, which for ease of reference, will be called the top side of the board. Once assembled, the top sides of the circuit boards face towards the body portion 22 and the interior of the device 20, in such a manner that they are protected. Additionally, mounting the circuit boards 24 and 26 perpendicularly to the base of the device 20, means that the foot print of the device is small. Less space is required to install the device on a third party circuit board than is required for prior art devices such as that shown in FIG. 1, for example.

On the underside of the boards, which for convenience shall be called the reverse side, no electrical components are installed. This allows the reverse side of the circuit boards 24 and 28 to act as the exterior housing of the device, without there being danger of damage to any essential components. Through holes 244 and 264 are provided in the reverse side of the circuit boards 24 and 26 and act as input and output terminals for the input and output feed circuits provided on the top side of the circuit boards. As will be explained later, in the example shown, two through holes 244 are provided in the first circuit board 24, and three through holes are provided in second circuit board 264. Through holes 246 and 266 are also provided for the transformer connections, as will be described later. As is known in the art, the output feed side of the device may have more outputs, than inputs provided at the input feed side. In this example, two input connections 244 are provided, while three output connections 264 are provided.

The operation of the transformer itself is not pertinent to the operation of the preferred embodiments of the present invention and no further discussion of the input or output feed circuits will be made.

The body portion 22 shown in FIG. 2 has an essentially I-shaped profile, including a top section 220, an intermediate portion 223, and a bottom or base section 225. The top section 220 provides a substantially flat top surface 221, and a thickness that accommodates a plurality of transformer wire wrap connections 222. The intermediate portion 223, includes substantially flat side sections 224, and extends between the top section 220 and a bottom section 225 to provide the height of the device, as well as a cavity in which the transformer coil 28 is housed. In this example, the side sections 224 extend from the side edges of the top section 220 to the side edges of the bottom section. Lastly, the bottom section 225 provides a substantially flat base for the device, as well as a thickness that accommodates surface mounting pins 226 to connect the device 20 to a circuit board 100 shown in FIG. 7 using solder or other suitable attachment methods, for example. Above the surface mounting pins 226, the base section also accommodates placed board connection pins 227 by which the circuit boards 24 and 26 are connected to the body portion 22. The surface mounting pins 226 and the placed board connection pins 227 are electrically connected to one another in the body section 22 so that the circuit boards 24 and 26 are connected to the surface mounting pins 226. In one example preferred embodiment of the present invention, the placed board connection pins 227 and the surface mounting pins 226 can be fabricated from a single piece of bent metal, extending inside the body portion 22. This simplifies construction and saves on space.

As is known in the art, the body portion 22 can be constructed from a plastic material such as liquid crystal polyester or poly (phenylene sulfide) in which the metal connections can be formed.

As shown in FIG. 3, the I-shaped profile of the body potion 22 is advantageous, as when the circuit boards 24 and 26 are attached to the body portion 22, the flat sides 224 of the intermediate portion 223 provides two exterior sides of the housing for the device 20, with the last two sides being provided by the top surface 221 and the base section 225. The I-shaped design also means that window portions 228 are created between the sides 224 and the circuit boards 24 and 26 allowing air to circulate between the interior of the device 20 and the exterior to assist in keeping the device cool. In other examples, the body portion 22 may have a shape that is not I-shaped, provided that it still acts as a central body for mounting the circuit boards 24 and 26, and has an exterior that can act as the external housing of the device 20.

Figure 4:
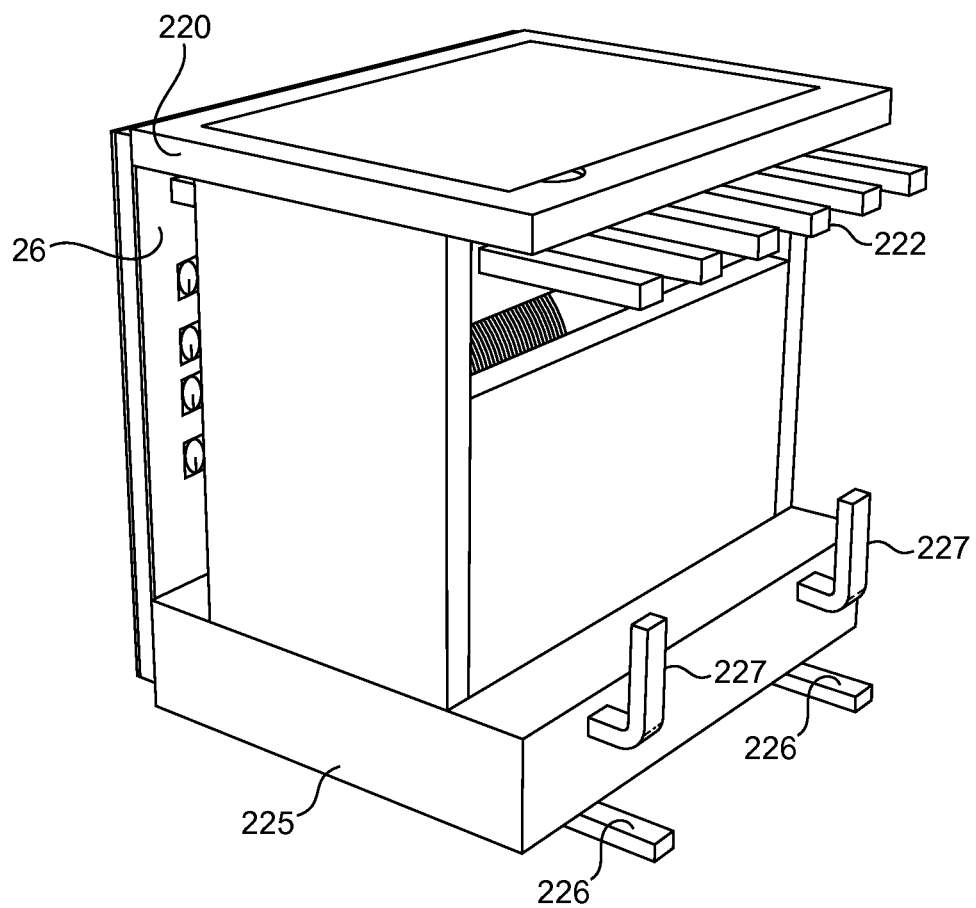
FIG. 4 is a side view of the example shown in FIG. 2, showing interior detail.

The connection of the circuit boards 24 and 26 to the body portion 22, will now be described in more detail with reference to FIGS. 3 and 4. FIG. 4 shows the device 20, with circuit board 26 in place, but with the circuit board 24 omitted. As a result, the surface mounting pins 226, the placed board connection pins 227, and the transformer wire wrap terminals 222 can be seen in more detail.

In FIG. 4, the placed board connection pins 227 have been bent upwards into a final mounting position. Initially, these pins 227 extend straight outwards from the body portion 22 so that they, and the transformer wire wrap terminal pins 222, may be inserted into respective through holes 244 and 246 in the circuit board 24. As is known in the art, through holes 244, 246, 264 and 266 are provided with surrounding copper connections to make a reliable connection with the pins 222 and 227 once soldered.

Figure 6:
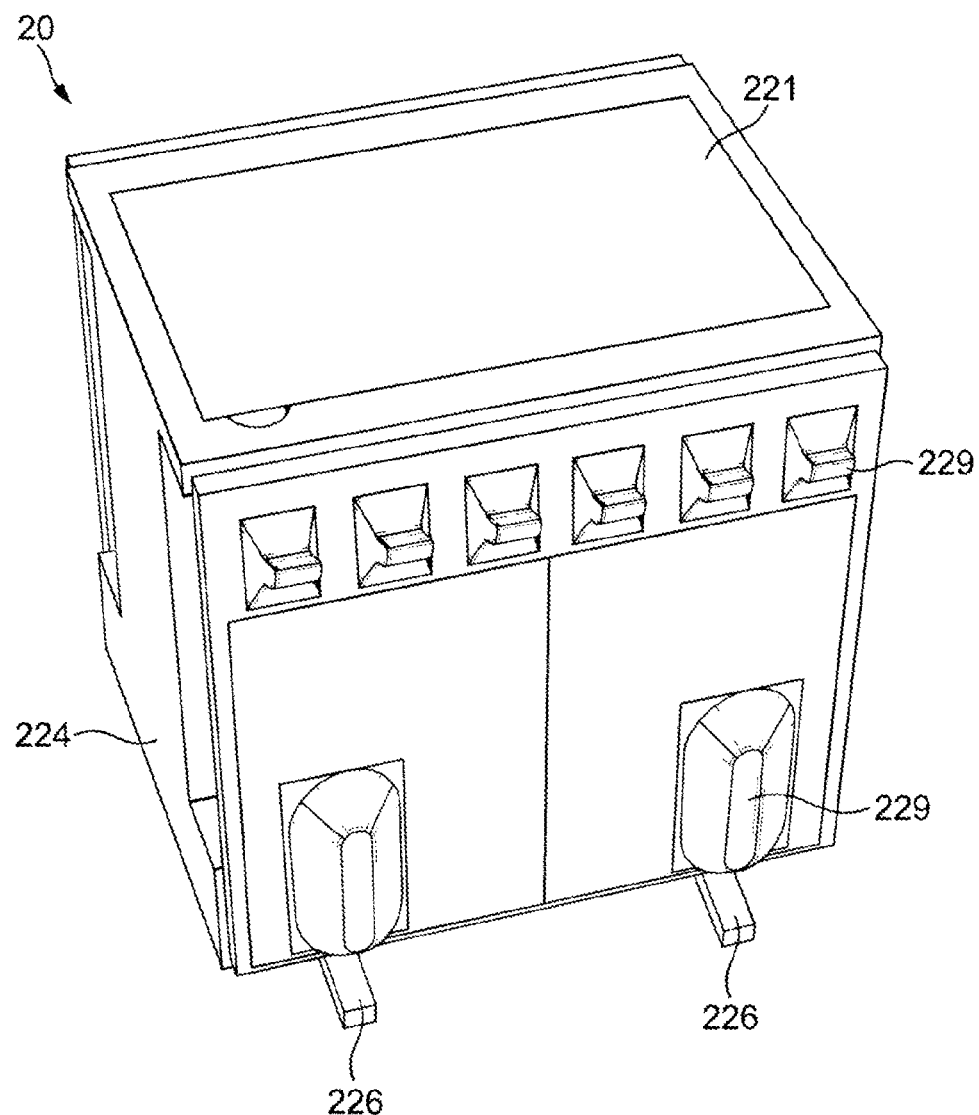
FIG. 6 is an isometric view of an example device according to a preferred embodiment of the present invention.

When assembling the device, the through holes 244 and 246 of circuit board 24 are therefore threaded onto the placed board connection pins 227 and transformer wire wrap terminals 222. The pins can then be soldered in place to form soldered connections 229, such as those visible in FIGS. 3 and 6. In this way, the pins 222 and 227 have the double purpose of mechanically and electrically connecting the circuit boards 24 and 26 to the body portion 22. As shown in FIG. 4, the placed board connection pins 227 can be bent upwards before soldering occurs to make a stronger mechanical connection and to hold the circuit board in place while the solder is applied.

The mounting procedure for circuit board 26 is identical to that described for circuit board 24, except that the number of pins 227 and 222 is not necessarily the same. In the DC-DC converter example being discussed here, the input side of the device 20 preferably includes two surface mounting pins 226 and therefore two placed board connection pins 227, and the output side of the device preferably includes three surface mounting pins 226 and therefore three placed board connection pins 227.

Figure 5:
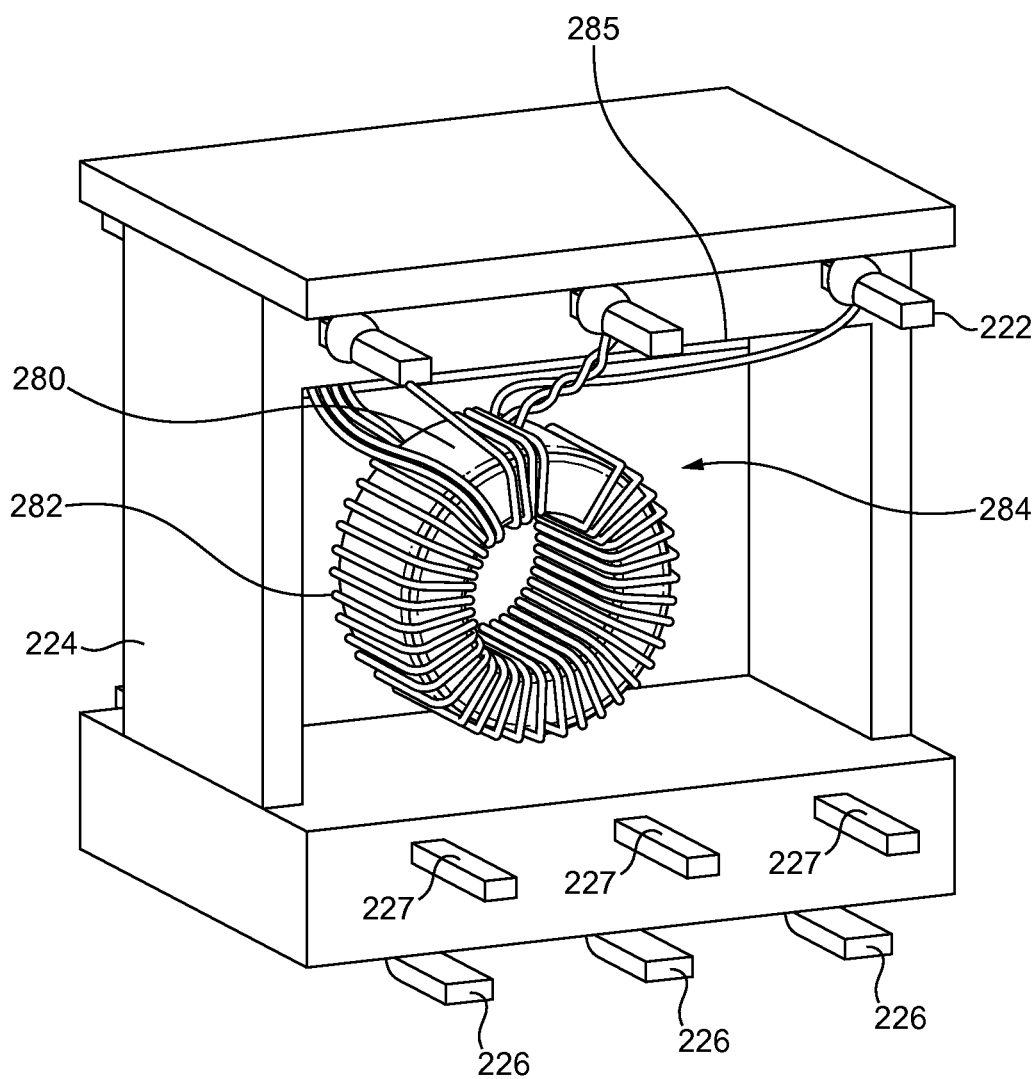
FIG. 5 is a side view of the example shown in FIG. 2, showing further interior detail.

The internal structure of the device 20 will now be described in more detail with reference to FIG. 5. FIG. 5 is a view of the device 20 with the second circuit board 26 removed, showing the transformer coil 28 connected in place with the transformer wire wrap terminals 222. In this view, it can be seen that on the output side of the device 20 there are only three transformer wire wrap terminals 222, as opposed to six on the input side.

The transformer coil 28 includes a core 280 and a number of windings 282. The transformer 28 is housed in a transformer cavity 284 within the body portion 22, where it may be held in place by any suitable material or method, such as glue or adhesive. One side of the cavity 284 may be open, as shown in FIG. 5, to allow access to the cavity 284 for installation. The remaining three sides can therefore be closed, completely or partially, such that the walls of the cavity 284 provide the intermediate section 223 and side walls 224. A gap 285 in the back wall of the cavity 284 allows the transformer windings to be passed from the cavity 284 to the input side of the device 20 for connection with the input side transformer wire wrap terminals 222.

The construction of the device described with reference to FIGS. 2 to 6 provides a number of advantages over the prior art.

The multifunctional header or body portion 22 acts as a carriage for the transformer 28, while also providing a rigid structure to support the device 20. The body portion 22 provides a mounting for the feet for attachment to an external circuit board and mounting for pins to facilitate electrical termination of the transformer wires. Furthermore, the top surface 221 of the body portion 22 is flat, facilitating surface pick and place processing operations.

The wire wrap terminations 222 for the transformer 28 have been integrated into the header, and act as the mechanical and electrical connections to the placed boards 24 and 26. This reduces the required size of the device 20.

The conductive pins 226 and 227 of the body portion 22 in conjunction with the through holes on the placed boards 24 and 26, define mounting members that are integral with the device 20 and that provide electrical connections.

The placed boards 24 and 26 and header portion are mounted on one another so as to define a cuboid-shaped structure. In the particular example disclosed herein, the cuboid preferably is six-sided, with the body portion 22 providing four of the sides of the device 20, and the first and second body portion boards (placed boards 24 and 26) providing the other two sides. In this way, the device 20 is provided with a flat surface for ease of packaging of the device 20 and helps to mechanically protect the electronic components inside. Thus, there is no need for an outer case, allowing the size of the device 20 to be reduced. Additionally, the case wall thickness and case tolerances no longer need to be taken into account. In practice, the device can be built to a size of less than about 9 mm per cube side and having a footprint of less than about 0.7 cm$^2$, for example.

The connected placed board connection pins 227 defining some of the surface mount pins 226 are also multifunctional, as they provide further mechanical and electrical connections to the placed boards 24 and 26. Bending the placed board connection pins 227 allows the placed boards 24 and 26 to be secured mechanically in place before the soldering process occurs and further strengthens the mechanical connection.

In one preferred embodiment, the surface mounting pins 226 and the placed board connection pins 227 can be provided as an integral metal section, bent around inside the body portion 22 into the required shape. This removes the need for separate mechanical connection and surface mount pins, and therefore reduces the size of the device 20.

The semi-open frame form of the device 20 provided by windows or openings 228 in the body portion 22 allow the device 20 to be cool during operation and use less energy. The openings in the sides of the body portion 22 are therefore located adjacent to the placed boards 24 and 26 so that heat generated by the components in the interior of the device 20 can escape. Furthermore, the reliability of the device 20 is increased as a result of its low operating temperature.

Figure 7:
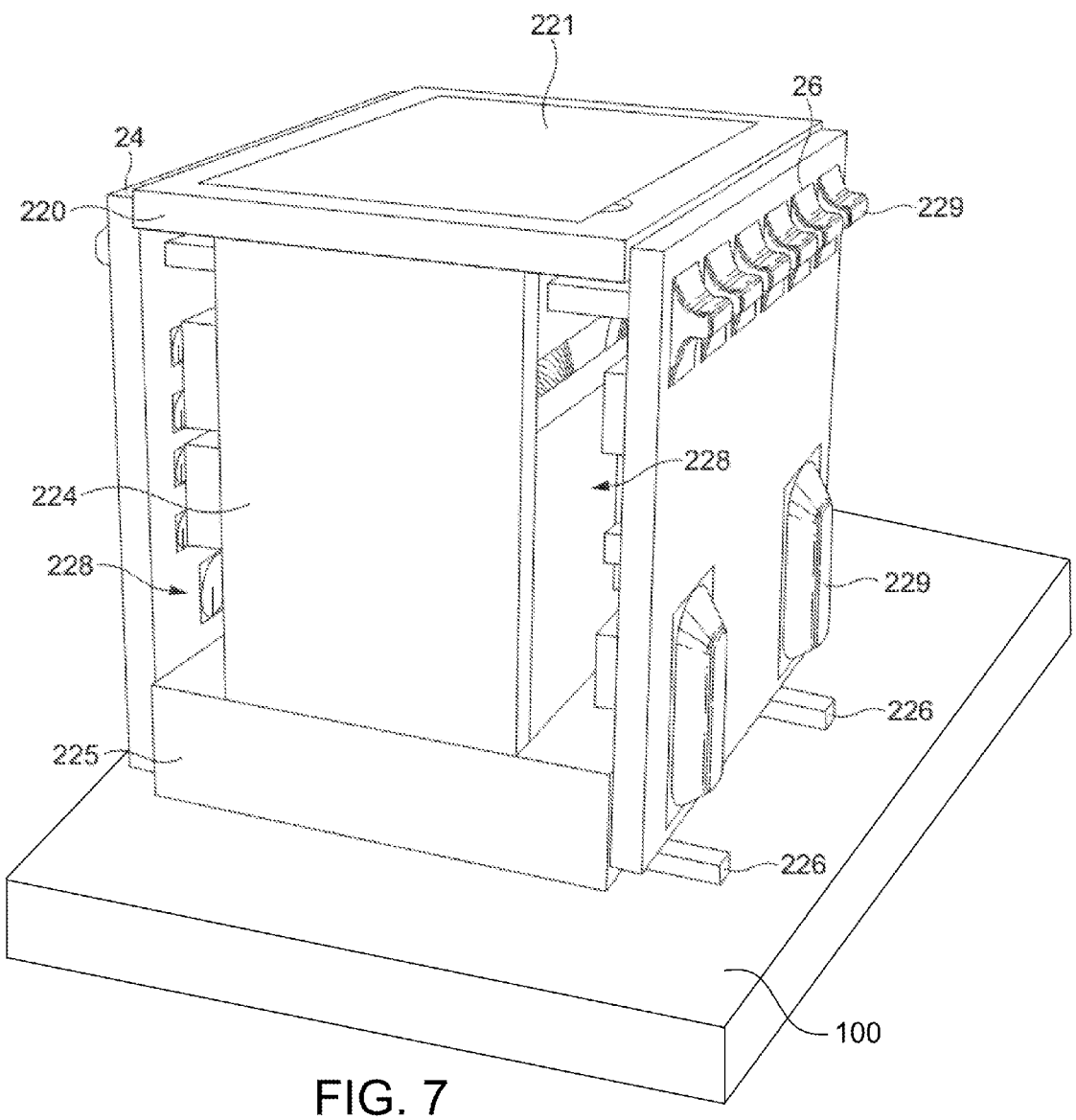
FIG. 7 is a perspective view of the example shown in FIG. 3 connected to a circuit board according to a preferred embodiment of the present invention.

Lastly, as the placed boards 24 and 26 are mounted on either side of a plastic header such that they will be perpendicular to the plane of a circuit board, for example, such as a third party customer's circuit board 100 as shown in FIG. 7, once mounted, the placed boards 24 and 26 have only a small impact on the overall footprint of the converter.

Although, preferred embodiments of the present invention have been described with reference to a DC-DC power converter, for example, it will be appreciated that the concept of mounting circuit boards on a central header or body portion, such that the reverse side of the circuit boards not having any electrical components mounted thereon define a portion of the exterior housing of the device, could be applied to any electronic device for surface mounting. Such devices may for example simply provide galvanic isolation between an input and an output side, such as transformer based isolators, optocouplers or capacitors.

Furthermore, although the device has been described as preferably having flat sides, and in the above discussion preferably is essentially cubic in shape, the device resulting from the combination of circuit board and header could be any shape providing it is suitable for use in pick and place processing operations.

The examples discussed above are intended to be illustrative of the preferred embodiments of the present invention. They are not intended to limit the definition of the present invention that is provided in the following claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component for surface mounting on a circuit board, comprising:
    a) a body portion including at least one surface mounting pin to connect the body portion to the circuit board;
    b) first and second body portion circuit boards including respective circuit elements mounted thereon; and
    c) mounting members; wherein
    the first and second body portion circuit boards are mounted on the body portion by respective ones of the mounting members, such that sides of the first and second body portion circuit boards on which the circuit elements are mounted face an interior of the electronic component and reverse sides of the first and second body portion circuit boards define an exterior surface of the electronic component;
    the mounting members comprising:
    at least one bent conductive pin and at least one straight conductive pin arranged on the body portion to provide an electrical connection to the circuit elements of the first and second body portion circuit boards; and
    at least one through hole arranged in the first and second body portion circuit boards to provide respective mechanical and electrical connections between the first and second body portion circuit boards and the at least one bent conductive pin; wherein
    the at least one bent conductive pin extends through the at least one through hole of one of the first and second body portion circuit boards from the body portion and is bent to include a bent portion.

2. The electronic component of claim 1, wherein the body portion comprises:
    a base section in which the at least one surface mounting pin is housed,
    a top section providing an exterior surface of the electronic component; and
    an intermediate section connecting the base section and the top section.

3. The electronic component of claim 2, wherein the first and second body portion circuit boards are mounted on opposite sides of the body portion.

4. The electronic component of claim 2, wherein the at least one bent conductive pin is mounted in the base section.

5. The electronic component of claim 1, wherein the at least one bent conductive pin is integral with a corresponding one of the at least one surface mounting pin.

6. The electronic component of claim 2, wherein the intermediate section of the body portion includes sides that extend between the base section and the top section to provide two sides of an exterior housing of the electronic component.

7. The electronic component of claim 6, wherein the sides of the intermediate section include openings extending into the interior of the electronic component.

8. The electronic component of claim 2, wherein the intermediate section includes an internal cavity arranged to mount an electrical element.

9. The electronic component of claim 8, wherein the electrical element is a transformer.

10. The electronic component of claim 9, wherein the first and second body portion circuit boards define input and output feed circuits for the transformer, and the at least one bent conductive pin is provided in the top section and defines transformer wire wrap terminals to connect the transformer between the input and output feed circuits.

11. The electronic component of claim 10, wherein the body portion, and the first and second body portion circuit boards together define a cuboid structure.

12. The electronic component of claim 1, wherein the bent portion of the at least one conductive pin faces the reverse side of the one of the first and second body portion circuit boards.

13. The electronic component of claim 9, wherein an axis of the transformer is parallel or substantially parallel to a normal direction of the first and second body portion circuit boards.

14. The electronic component of claim 1, wherein a surface mounting portion of the at least one bent conductive pin is larger than a surface mounting portion of the at least one straight conductive pin.

15. A method of constructing an electronic component for surface mounting on a circuit board, the method comprising:
   mounting first and second body portion circuit boards, on which respective circuit elements are mounted, on a body portion of the electronic component such that sides of the first and second body portion circuit boards on which the circuit elements are mounted face an interior of the electrical component and reverse sides of the first and second body portion circuit boards form an exterior surface of the electronic component; wherein
   in the mounting step:
   at least one bent conductive pin provided on the body portion of the electronic component is threaded into at least one through hole on a respective one of the first and second body portion circuit boards, is bent to include a bent portion, and is soldered to the respective one of the first and second body portion circuit boards; and
   at least one straight conductive pin is provided on the body portion.

16. An electronic component for surface mounting on a circuit board, comprising:
   a) a body portion including:
      a base section in which at least one surface mounting pin is housed to connect the body portion to the circuit board,
      a top section,
      a first side wall connecting and extending along first edges of the base section and the top section,
      a second side wall connecting and extending along second edges of the base section and top section,
      an intermediate section extending between the first side wall and the second side wall, and
      an electrical element mounted on the intermediate section;
   b) first and second body portion circuit boards including respective circuit elements mounted thereon, wherein
   the first and second body portion circuit boards are mounted to the base section and the top section such that sides of the first and second body portion circuit boards on which the circuit elements are mounted face an interior of the electronic component, and
   the first and second side walls include openings extending into the interior of the electronic component, and
   the base section, the top section, the first side wall, the second side wall, the intermediate section, and one of the first and second body portion circuit boards enclose the electrical element on six sides except at the openings of the first side wall and the second side wall.

17. The electronic component of claim 16, wherein the first and second body portion circuit boards are mounted on opposite sides of the body portion.

18. The electronic component of claim 16, wherein at least one of the top or the base sections comprises at least one conductive pin arranged to provide an electrical connection to the circuit elements mounted on the first and second body portion circuit boards.

19. The electronic component of claim 18, wherein the first and second body portion circuit boards comprise at least one through hole to provide mechanical and electrical connections between the first and second body portion circuit boards and the at least one conductive pin.

20. The electronic component of claim 19, wherein the at least one conductive pin extends through the at least one through hole of the first and second body portion circuit boards from the body portion, and is bent back towards one of the reverse sides of one of the first and second body portion circuit boards.

21. The electronic component of claim 20, wherein the at least one conductive pin is mounted in the base section.

22. The electronic component of claim 20, wherein the at least one conductive pin is integral with a corresponding one of the at least one surface mounting pin.

23. The electronic component of claim 16, wherein the intermediate section includes an internal cavity with a surface that is the at least one main surface of the intermediate section on which the electrical element is mounted.

24. The electronic component of claim 23, wherein the electrical element is a transformer.

25. The electronic component of claim 24, wherein the first and second body portion circuit boards define input and output feed circuits for the transformer, and the at least one conductive pin defines transformer wire wrap terminals to connect the transformer between the input and output feed circuits.

26. The electronic component of claim 16, wherein the body portion, and the first and second circuit body portion circuit boards together define a cuboid structure.

27. The electronic component of claim 24, wherein an axis of the transformer is parallel or substantially parallel to a normal direction of the first and second body portion circuit boards.

28. A method of constructing an electronic component for surface mounting on a circuit board, comprising:
   a) providing a body portion including:
      a base section in which at least one surface mounting pin is housed to connect the body portion to the circuit board,
      a top section, and
      a first side wall connecting and extending along first edges of the base section and the top section,
      a second side wall connecting and extending along second edges of the base section and top section,
      an intermediate section extending between the first side wall and the second side wall, and
      an electrical element mounted to the intermediate section;
   b) mounting on the body portion of the electronic component first and second body portion circuit boards on which respective circuit elements are mounted such that sides of the first and second body portion circuit boards on which the circuit elements are mounted face an interior of the electronic component, wherein
   in the mounting step, at least one conductive pin provided on the body portion of the electronic component is threaded into at least one through hole on a respective one of the first and second body portion circuit boards and soldered to the respective one of the first and second body portion circuit boards;
   the first side wall and the second side wall include openings extending into the interior of the electronic component; and
   the base section, the top section, the first side wall, the second side wall, the intermediate section, and one of the first and second body portion circuit boards enclose the electrical element on six sides except at the openings of the first side wall and the second side wall.

\* \* \* \* \*